United States Patent
Amrine et al.

(10) Patent No.: US 7,741,151 B2
(45) Date of Patent: Jun. 22, 2010

(54) INTEGRATED CIRCUIT PACKAGE FORMATION

(75) Inventors: Craig S. Amrine, Tempe, AZ (US); William H. Lytle, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 43 days.

(21) Appl. No.: 12/266,406

(22) Filed: Nov. 6, 2008

(65) Prior Publication Data

US 2010/0112756 A1    May 6, 2010

(51) Int. Cl.
*H01L 21/00* (2006.01)
(52) U.S. Cl. .................. 438/107; 438/113; 438/118; 438/612; 438/613; 257/E21.499; 257/E21.503; 257/E23.001; 257/E23.067; 257/E23.171; 257/E23.172; 257/E25.011; 257/E25.012
(58) Field of Classification Search ......... 438/108–126, 438/612, 613; 257/E21.499, 503, E23.001, 257/67, 84, 171, 178, 194, E25.011, 12
See application file for complete search history.

(56) References Cited

U.S. PATENT DOCUMENTS

| 4,549,200 | A | * | 10/1985 | Ecker et al. ................ 174/260 |
| 4,918,811 | A | * | 4/1990 | Eichelberger et al. ....... 438/107 |
| 5,111,278 | A | * | 5/1992 | Eichelberger ............... 257/698 |
| 5,144,747 | A | | 9/1992 | Eichelberger |
| 5,149,662 | A | * | 9/1992 | Eichelberger ................ 438/15 |
| 5,492,586 | A | * | 2/1996 | Gorczyca .................... 156/245 |
| 5,561,085 | A | * | 10/1996 | Gorowitz et al. ............ 438/125 |
| 5,628,919 | A | * | 5/1997 | Tomura et al. ................ 216/18 |
| 5,841,193 | A | * | 11/1998 | Eichelberger ................ 257/723 |
| 6,150,193 | A | * | 11/2000 | Glenn ......................... 438/113 |
| 6,774,472 | B2 | * | 8/2004 | Pierson ........................ 257/685 |
| 6,939,789 | B2 | * | 9/2005 | Huang et al. ................ 438/612 |
| 7,015,075 | B2 | | 3/2006 | Fay et al. |
| 7,094,633 | B2 | | 8/2006 | Takiar |
| 7,291,874 | B2 | | 11/2007 | Hsu |
| 7,511,365 | B2 | * | 3/2009 | Wu et al. ..................... 257/676 |
| 7,619,304 | B2 | * | 11/2009 | Bauer et al. ................. 257/678 |
| 2008/0057625 | A1 | * | 3/2008 | Chan et al. .................. 438/113 |
| 2009/0261468 | A1 | * | 10/2009 | Kroeninger et al. ......... 257/690 |
| 2010/0001396 | A1 | * | 1/2010 | Meyer et al. ................ 257/723 |

FOREIGN PATENT DOCUMENTS

WO    0075983  A1    12/2000

OTHER PUBLICATIONS

R. Iscoff, "On the Cutting Edge: Laser, Water Singulation Bid for Acceptance in a Saw-Dominated Market", ChipScale Review, Aug. 2003 issue, feature article.
R. Iscoff, "Prime Cuts: What Users Want in Singulation Tools", ChipScale Review, Aug.-Sep. 2001.

* cited by examiner

*Primary Examiner*—Michael S Lebentritt
(74) *Attorney, Agent, or Firm*—David G. Dolezal

(57) ABSTRACT

Integrated circuit packages are formed from a panel where the panel is separated by laser cutting the panel. In some embodiments, the panel is attached to the carrier for the formation of interconnect layers on the panel. Afterwards, the panel is cut with a laser while on the carrier to separate the integrated circuit packages. A tape or other type of structure may be attached to the top of the packages after the laser cutting. The integrated circuit packages are removed from the carrier by releasing the adhesive and removing the integrated circuit packages with the tape. The packages are then removed from the tape.

20 Claims, 5 Drawing Sheets

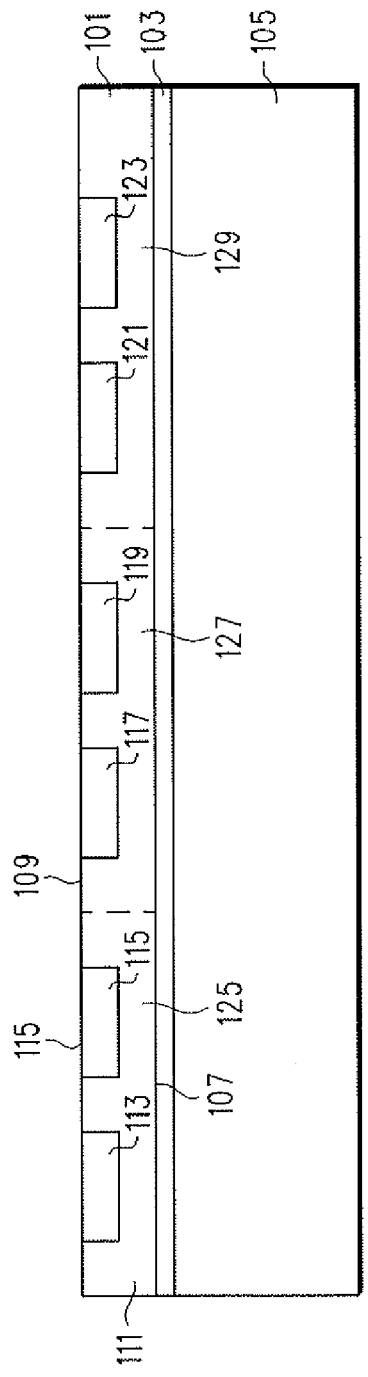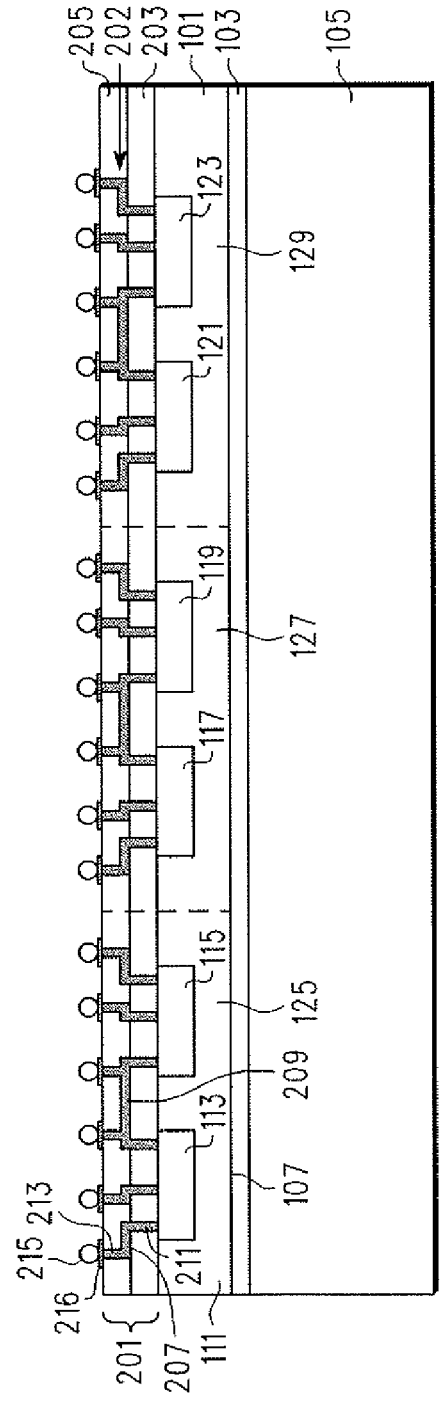

US 7,741,151 B2

INTEGRATED CIRCUIT PACKAGE FORMATION

BACKGROUND OF THE INVENTION

1. Field of the Invention

This invention relates in general to forming integrated circuit packages and more specifically to separating integrated circuit packages during manufacture.

2. Description of the Related Art

In the manufacture of some integrated circuit packages, multiple integrated circuit chips are encapsulated in encapsulant to form a panel. Interconnect layers are then formed on the panel. Afterwards, the panel is separated into multiple integrated circuit packages. However, during the separation, stresses and warping may occur that could damage the integrated circuit packages of the panel.

What is needed is an improved method of manufacturing integrated circuit packages.

BRIEF DESCRIPTION OF THE DRAWINGS

The present invention may be better understood, and its numerous objects, features, and advantages made apparent to those skilled in the art by referencing the accompanying drawings.

FIGS. 1-7 are views of various stages in the manufacture of integrated circuit packages according to one embodiment of the present invention.

The use of the same reference symbols in different drawings indicates identical items unless otherwise noted. The Figures are not necessarily drawn to scale.

DETAILED DESCRIPTION

Figure 3:
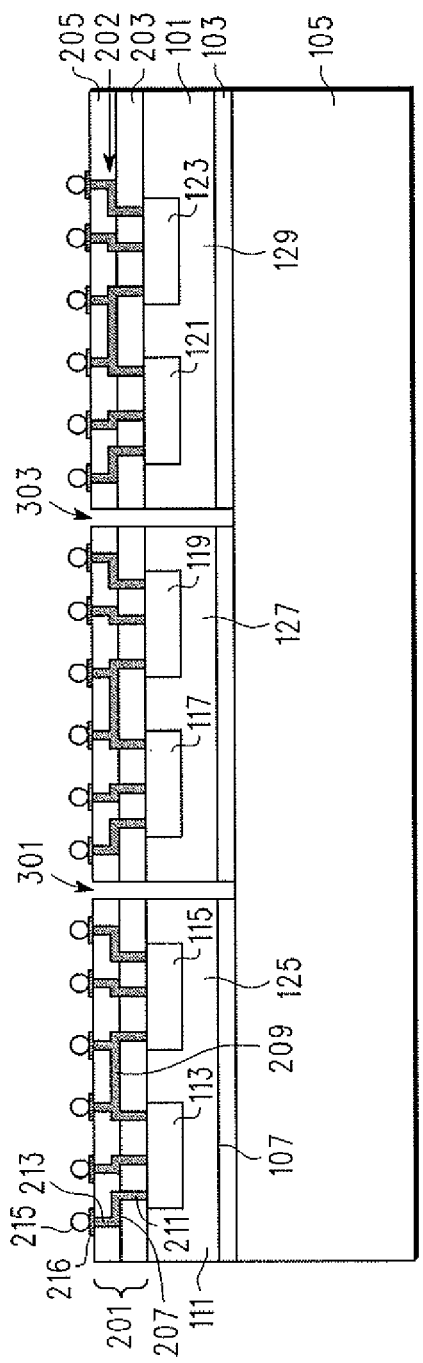

The following sets forth a detailed description of a mode for carrying out the invention. The description is intended to be illustrative of the invention and should not be taken to be limiting.

As disclosed herein, integrated circuit packages are formed from a panel where the panel is separated by laser cutting the panel. In some embodiments, the panel is attached to the carrier for the formation of interconnect layers on the panel. Afterwards, the panel is cut with a laser while on the carrier to separate the integrated circuit packages. A tape or other type of structure may be attached to the top of the packages after the laser cutting. The integrated circuit packages are removed from the carrier by releasing the adhesive and removing the integrated circuit packages with the tape. The packages are then removed from the tape.

FIG. 1 is a cutaway side view of a panel 101 attached to a carrier 105 with an adhesive 103. In the embodiment shown, panel 101 includes a number of integrated circuit chips (e.g. 113, 115, 117, 119, 121, and 123) that are encapsulated with an encapsulate 111. The integrated circuit chips are formed from processing wafers (not shown) with semiconductor, dielectric, and conductive material and then singulating the wafer into integrated circuit chips. Circuitry such as microprocessors, memories, ASICs, sensors, MEMS devices, analog circuits, digital logic, wireless circuitry, or combinations thereof may be implemented in the integrated circuit chips.

In one embodiment, encapsulate 111 includes a silica filled liquid epoxy. In one embodiment, the silica particle size is between 5-50 microns with the percentage of silica by weight in the range of 80-90 percent. In one embodiment, the epoxy is Hysol 4450. In other embodiments, other types of encapsulants may be used such as types of molding compound including other types of epoxy. In other embodiments, encapsulant 111 may include multiple materials.

In one embodiment, panel 101 is formed by attaching the integrated circuits active side down to another carrier (not shown) with a two sided adhesive tape. The integrated circuits are then encapsulated in the encapsulant 111. In some embodiments, a ground plane (not shown) may also be attached to the other carrier with openings for the chips. Also in other embodiments, other types of electronic devices (e.g. capacitors, inductors) may be encapsulated with the chips as well. Also, panel 101 may include other structures (not shown) as well.

In one embodiment, the integrated circuit chips are placed in a grid pattern for the formation of individual integrated circuit packages when singulated. For example, chips 113 and 115 are located in package 125, chips 117 and 119 are located in package 127, and chips 121 and 123 are located in package 129. Other embodiments may include a different number of chips per package (e.g. 1, 3, or more). Also in other embodiments, there may be a greater number of packages per panel, including where the packages are laid out in a two dimension arrangement in the panel (e.g. in a 3×2, 4×2, or 3×3 arrangement).

In one embodiment, the panel has a thickness of 0.8 mm, but may have other thicknesses in other embodiments. Also in other embodiments, the non active side of panel 101 (the bottom side in the view of FIG. 1) may be ground down after encapsulation. In other embodiments, the non active side may be ground to the bottom (relative to the view shown in FIG. 1) of the thickest chip. A panel including a plurality of integrated circuit chips encapsulated in an encapsulant includes embodiments where both major sides of a chip are exposed through the encapsulant of a panel. Still in other embodiments, the panel may include a back ground plane (not shown) formed on the non active side of the encapsulant after the encapsulating.

After the formation of panel 101, panel 101 is removed from the other carrier by exposing the panel to a releasing agent (e.g. heat, UV radiation, or a particular solution) that releases the adhesive of the tape. In one embodiment, a releasing agent releases the adhesive by breaking down the adhesive strength of the adhesive. In other embodiments, an adhesive is released by dissolving the adhesive.

After panel 101 has been removed from the other carrier, it may be cleaned in some embodiments. Panel 101 is then attached to carrier 105 active side up with adhesive 103. In some embodiments, adhesive 103 may be located on a tape with adhesive on the other side of the tape contacting carrier. Accordingly a panel attached to a carrier with an adhesive may include embodiments where a tape is located between the panel and the carrier.

Carrier 105 is a rigid structure that is used to support panel 101 during subsequent processes. In some embodiments, carrier 105 is made of a ceramic material. In some embodiments, carrier 105 is made of a ceramic alumina material. It is preferable in some embodiments, that the carrier be made of a highly ridged material that includes alumina, silicon carbide, or zirconium oxide. In some embodiments, alumna is preferable due to its cost relative to other such materials.

FIG. 2 is a cutaway side view after the formation of an interconnect layer and external conductive devices on panel 101. In the embodiment shown, an interconnecting structure 201 including interconnect layer 202 is formed on panel 101. Interconnect structure 201 includes dielectric layers 203 and 205 with interconnect layer 203 formed in between. In the embodiment shown, interconnect structure 201 includes electrically conductive interconnect structures (e.g. 207, 209) that transfer signals (including data, power, and ground) between the integrated circuit chips of a package and between an integrated circuit chip and an external conductor. For example, interconnect 209 electrically connects chip 113 and 115. In the embodiment shown, the external conductors are solder balls (e.g. 215), but may be of other types of external connectors (e.g. bond pads) in other embodiments. In some embodiments, interconnect structure 201 enables the pitch of the solder balls (e.g. 9.3 mm in the x and y direction) to be significantly greater than the pitch of the bond pads (not shown) on the active side of the chips.

In one embodiment, of forming interconnect structure 201, a dielectric layer 203 is formed on the top major side of panel 101. Dielectric layer 203 may be formed of one or more layers of dielectric material. Openings are then formed in layer 203 to expose the bond pads of the integrated circuit chips. A layer of conductive material (or layers of different types of conductive material) are then formed on layer 203 including in the openings to contact the bond pads of the integrated circuit chips. In the embodiment shown, the conductive material completely fills the openings to form vertical conductive structures (e.g. 211), but may in other embodiments only partially fill the openings. Afterwards, the conductive layer is patterned to form the individual electrically conductive interconnects (e.g. 207 and 209). In one embodiment, the electrical interconnects (e.g. 207) are formed of one or more electrically conductive materials (e.g. copper, tungsten, titanium, titanium nitride, silver, gold). In the embodiment shown, the openings in layer 203 have generally vertical sidewalls. But in other embodiments, the sidewalls may be more slanted.

In embodiment shown, a passivation or top dielectric layer 205 is formed over the patterned interconnects. Openings are made in layer 205 to expose the conductive interconnects and then are filled with conductive material to form vias (e.g. 213). Afterwards, bond pads (e.g. 216) are formed on vias 213, wherein the solder balls (e.g. 215) are formed on the bond pads. In other embodiments, layer 205 may be sufficiently thin, such that the solder balls are formed in the openings of layer 205 and electrically contact the interconnects of interconnect layer 202.

Other embodiments may include a greater number of interconnect layers (e.g. 202). In such embodiments, a second interconnect layer maybe formed by forming openings in layer 205 to expose the interconnects of interconnect layer 202 and then forming a conductive layer over layer 205 including forming conductive material in the openings. Afterwards, the conductive layer may be patterned to form the individual interconnects. Accordingly, interconnect structure 201 may include any number of interconnect layers as desired for signal distribution.

The proceeding paragraphs have described embodiments of forming an interconnect structure with one or more interconnect layers. However, those of skill in the art, based upon the teachings herein, could form an interconnect structure with different structures and in different ways. For example, vertical structures 211 could be formed separately from the horizontal portion of interconnect 207.

FIG. 3 shows a cutaway side view after panel 101 and interconnect structure 201 have been laser cut into individual integrated circuit packages 125, 127, and 129. The laser cutting may be performed by different types of lasers in different embodiments. In some embodiments, deep UV lasers such as excimer lasers having a laser beam wavelength of e.g. around 230 nm may be used. YAG (yttrium-aluminum-garnet) lasers may also be used. YAG lasers normally have a laser beam wavelength of 1065 nm, but can be altered to different wavelengths (e.g. 530 nanometers or 355 nanometers) with the appropriate optics. CO2 lasers (with a laser beam wavelength of e.g. around 10,000 nanometers) may be used in some embodiments. CO2 lasers are available in very high power. However, CO2 lasers may not be preferable for some embodiments due to their capacity to destroy ceramic materials.

In some embodiments, the laser cutting may be performed with a laser beam at any available wavelength. In some embodiments, the choice of wavelength used depends mainly on the material to be cut and the carrier material. While longer laser beam wavelengths are generally more effective in cutting, they also tend to undesirably heat up the surrounding material. As a result, in some embodiments, laser beam wavelengths between 350 and 530 nanometers are preferable in that they provide, in some embodiments, a reasonable balance between effective cutting speed with minimal heat damage to the packages. At these wavelengths in some embodiments, there is minimal damage to the underlying ceramic carrier (e.g. light discoloration of the ceramic carrier).

In some embodiments, the power level of the laser beam can range from 5 to 50 Watts, but other power levels may be used in other embodiments. In some embodiments, lower power levels may require extra passes to fully cut through the material, but may result in less thermal damage of the packages.

In a specific embodiment, an Electro-Scientific Industries (ESI) laser tool model number 5330 with a laser beam wavelength of 355 nanometers and a power level of 5.8 Watts is used to cut panel 101 and interconnect structure 201. However, other lasers maybe used in other embodiments.

In one embodiment, a double cut with the laser is made for separating the panel into the integrated circuit packages. In one embodiment, the kerf width (the width of the cut) is 40 microns, but may be of other widths in other embodiments. In one embodiment, the major sides of the integrated circuit packages have a rectangular shape, but may have other shapes in other embodiments.

In one embodiment, the carrier is of a substance (e.g. alumina ceramic) that is resistant to damage by the laser beam at the power and wavelength used during the laser cut. In some of these embodiments, the only effect of the laser on carrier 105 is some scorching of carrier 105 which does not affect the mechanical integrity of the carrier. Accordingly, with little or no reconditioning, carrier 105 can be reused to support an other panel for the formation of an interconnect structure on the other panel and subsequent singulation.

Figure 4:
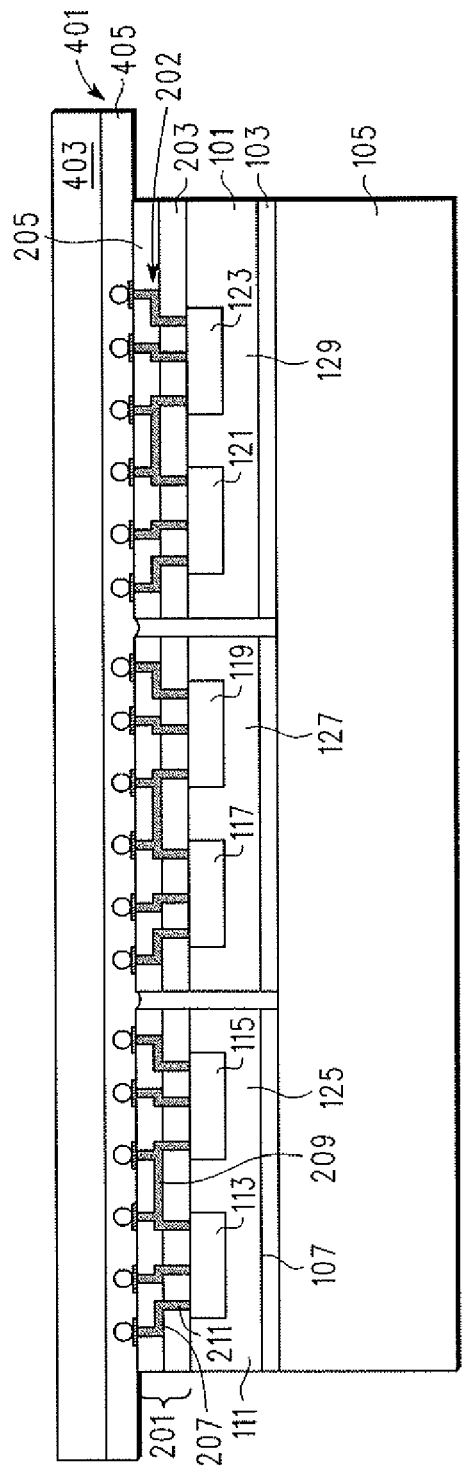

FIG. 4 shows a side view after a tape 401 is attached to each of the integrated circuit packages 125, 127, and 129. In the embodiment shown, tape 401 includes a backing material 403 and an adhesive 405. In one embodiment, adhesive 405 is UV releasable (the adhesive degrades or loses its adhesive properties when exposed to UV radiation) such that material 403 can be separated from packages 125, 127, and 129. In one embodiment, material 403 is transparent. In one embodiment, tape 401 is ADWILL-203 UV release tape sold by LINTEC ADVANCED TECHNOLOGIES INC.

In other embodiments, other types of structures (e.g. carriers, films) may be used instead of tape 401. In these embodiments, the structure would be attached to the integrated circuit packages with an adhesive.

Figure 5:
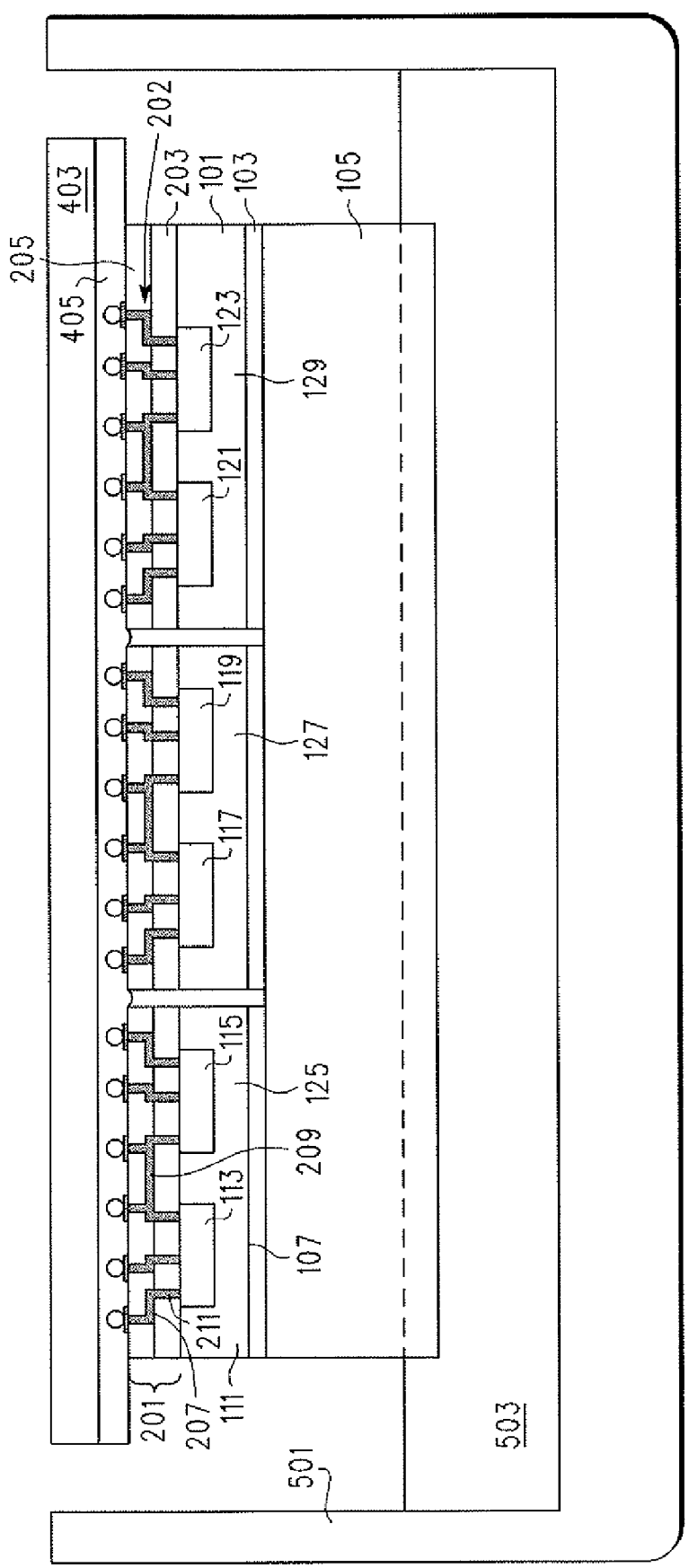

FIG. 5 shows a portion of carrier 105 being submersed in a solvent bath 503 in tub 501 for releasing integrated circuit packages 125, 127, and 129 from carrier 105 by releasing adhesive 103 with solvent bath 503. In one embodiment, solvent from solvent bath 503 is absorbed by a capillary action through pores of carrier 105 where it contacts adhesive 103. In the embodiment shown, carrier 105 has pores with a diameter in the range of 0.002-30 microns, but may have other pore sizes in other embodiments.

In one embodiment, the solvent releases adhesive 103 by breaking down the adhesive strength of adhesive 103. In one embodiment, adhesive 103 is a silicone based adhesive such as Gel-Pak GPTA, and a commercial solvent such as acetone or limonene can be used to cause the adhesive to soften and release. In other embodiments, other types of releasing solutions may be used depending upon the type of adhesive used for attaching panel 101 to carrier 105. In other embodiments, a greater portion of carrier 105 may be submersed in solvent bath 503. In still in other embodiments, the entire assembly including the integrated circuit packages 125, 127, and 129 may be submersed in solvent bath 503.

During the exposure of carrier 105 to solvent bath 503, adhesive 405 is unaffected by solvent. Adhesive 405 is of a different release type than adhesive 103 wherein the adhesive strength of adhesive 405 is generally not affected by the solvent of the solvent bath 503. Accordingly, integrated circuit packages 125, 127, and 129 will remain attached to tape 401 after carrier 105 has been released from the integrated circuit packages. Adhesives of different release types are adhesives that release in response to different releasing agents. For example, adhesive 405 is a UV release type in which adhesive 405 releases by exposure to UV radiation but generally retains adhesive strength when exposed to bath 503 as opposed to adhesive 103. Two adhesives of difference release types may be two adhesives that release as a result of being exposed to different solutions.

Figure 6:
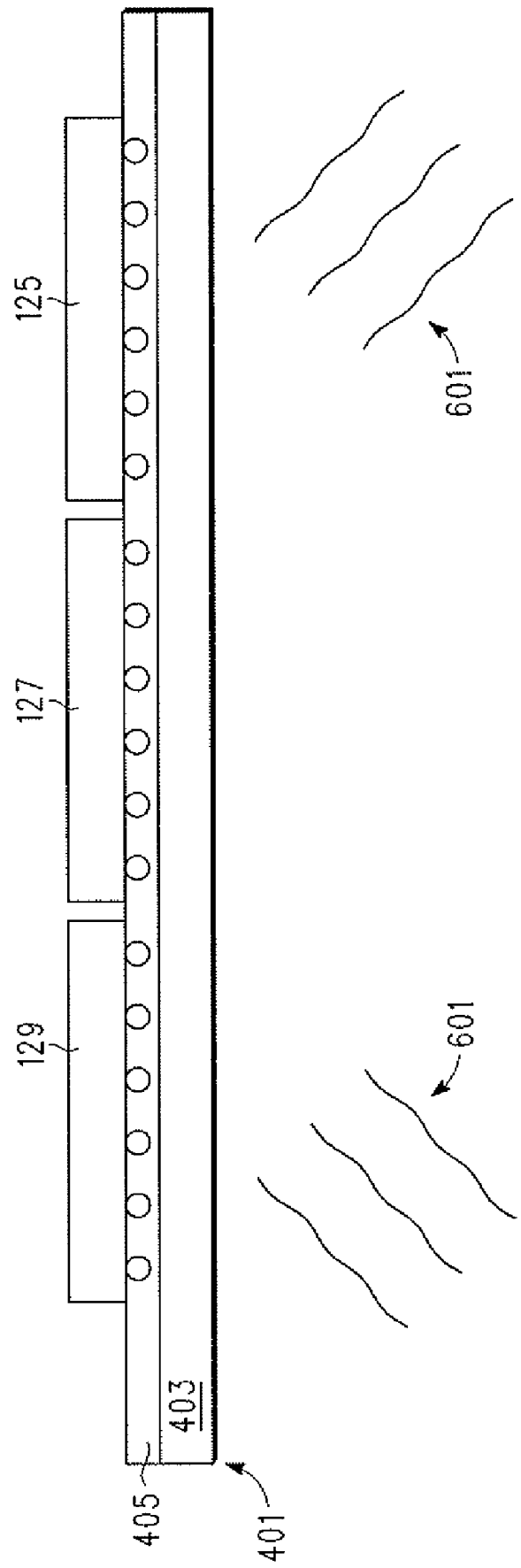

FIG. 6 is a side view of tape 401 and packages 129, 127, and 125 where the packages and tape are exposed to UV radiation 601 to release adhesive 405. In one embodiment, radiation 601 is at wavelength of 365 nanometers, but may be of other wavelengths in other embodiments, depending on the type of adhesive being used. Prior to being exposed to radiation 601, tape 401 (including packages 129, 127, and 125 attached thereto) is lifted from carrier 105 and turned upside down for UV exposure.

Figure 7:
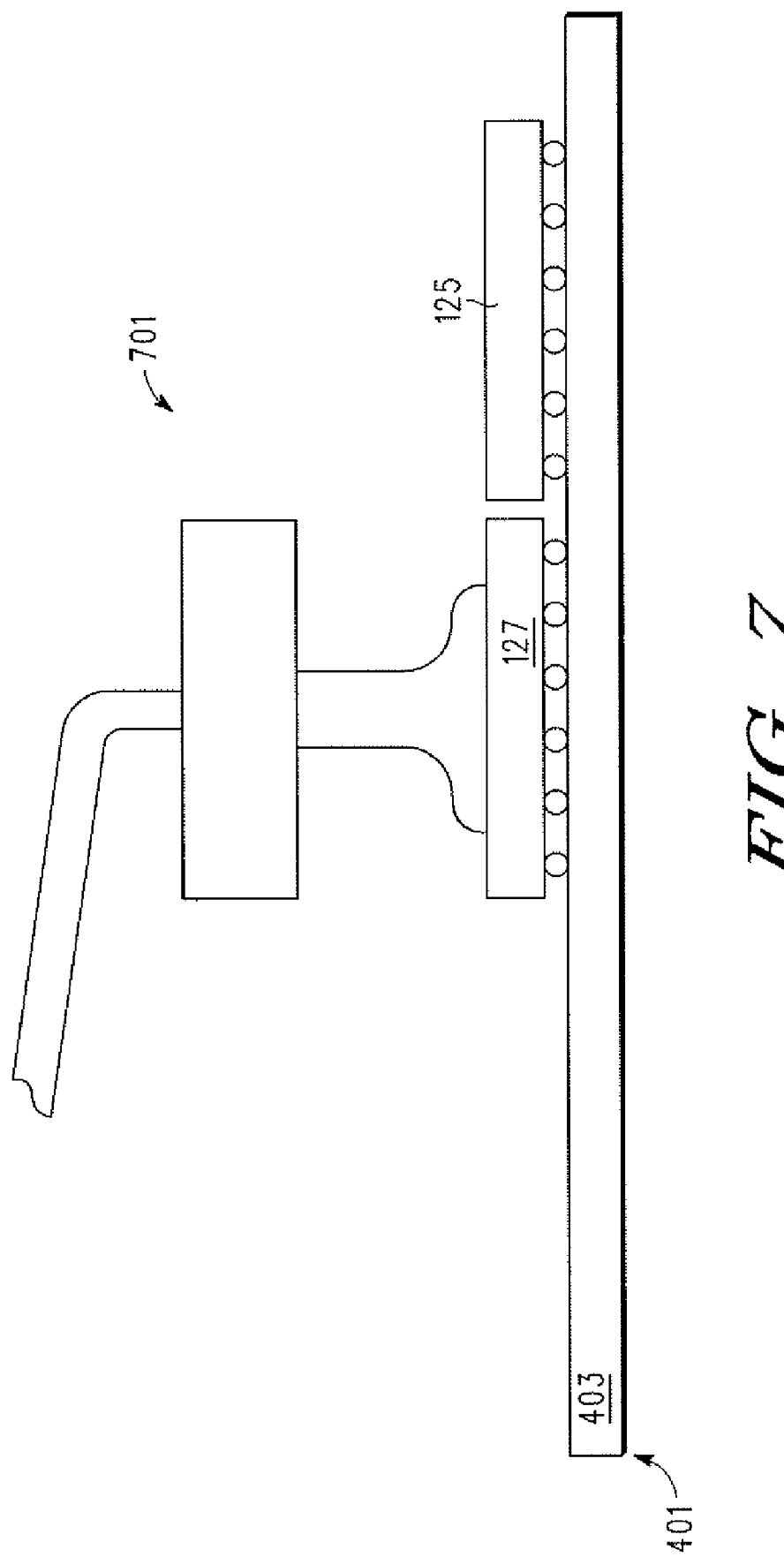

FIG. 7 shows a side view of an automatic package picking machine 701 that individually picks up the packages from tape backing 403 after adhesive 405 has been released. In one embodiment, machine 701 picks up each package by the use of suction, but may use other techniques (e.g. by mechanical claws) in other embodiments. In one embodiment, machine 701 is sold by Laurier DS-9000 from Besi Die Handling, Inc of Londonderry N.H., USA.

In some embodiments, after removal from carrier 105, tape 401 and the packages attached thereto are place on a manufacturing assembly line where the tape is exposed to UV radiation 601 at a station just prior to the station of machine 701. In some embodiments, the UV radiation lamps that provide the UV radiation and machine 701 maybe located at the same station, wherein tape 401 is not moved for package removal after being exposed to UV radiation.

In other embodiments, both adhesive 103 and adhesive 405 may be of different releasing types. For example, adhesive 103 may be of a UV releasing type and adhesive 405 by be of a heat releasing type. In another embodiment, adhesives 103 and 405 may be releasable in response to different solutions.

Having a process where adhesive 405 and adhesive 103 are of different release types allows for the removal of carrier 105 from the integrated circuit packages while still controlling the location of the integrated circuit packages for further manufacturing processes. If tape 401 were not used, then the integrated circuit packages may fall into tub 501 when adhesive 103 is released. Accordingly, with the method described herein, the packages are kept together after their release from carrier 105, and automatic machinery can be used for further processes.

Afterwards carrier 105 can be reused for building an interconnect structure on another panel and signulating by a process similar to that described above.

Laser cutting a panel and interconnect structure on the carrier that is used to support the panel during interconnect structure formation allows for a process that subjects the panel and interconnect structure to less warping and stress during the singulation of the panel and interconnect structure. With prior art methods, after interconnect structure formation, the panel is removed from the carrier where it is cut with a saw or laser. With these processes, the panel and interconnect structure may be susceptible to damage due to its removal. With such prior art process, the release of the panel from the carrier prior to singulation may subject the assembly to stress and warping due to the loss of support and attachment of the supporting structure. Accordingly, by leaving the panel and interconnect structure attached to the carrier, the amount of warping and stress on the panel and interconnect structure during singulation is reduced.

In other embodiments, the processes set forth above may be used to singulate a panel attached to a carrier where no interconnect structure has been subsequently formed post encapsulation. For example, laser cutting may be performed on a panel that is attached to a carrier that supported the integrated circuit chips during encapsulation. After the laser cutting, a tape with an adhesive of a different releasing type may be attached to the singulated packages. The packages would then be removed from the carrier.

In one embodiment, a method for making an integrated circuit package includes providing a panel attached to a carrier. The panel includes a first major surface attached to the carrier. The panel includes a plurality of integrated circuit chips encapsulated with an encapsulant. The method includes forming at least one interconnect layer on a second major surface of the panel. The second major surface is an opposite surface to the first major surface. The panel is supported by the carrier during the forming. The method includes laser cutting the panel into a plurality of integrated circuit packages after the forming. The panel is supported by the carrier during the laser cutting. Each integrated circuit package includes at least one integrated circuit chip of the plurality of integrated circuits chips. The method includes removing the plurality of integrated circuit packages from the carrier after the laser cutting.

In another embodiment, a method of making an integrated circuit package includes providing a panel attached to a carrier. The panel includes a first major surface attached to the carrier with an adhesive of a first releasing type. The panel includes a plurality of integrated circuit chips encapsulated with an encapsulant. The method includes laser cutting the panel into a plurality of integrated circuit packages. The panel is supported by the carrier during the laser cutting. Each integrated circuit package of the plurality of integrated circuit packages includes at least one integrated circuit chip of the plurality of integrated circuit chips. The method further includes after the laser cutting, attaching a first structure to each integrated circuit package of the plurality of integrated circuit packages at an opposite side from the first major surface of the panel with an adhesive of a second releasing type that is different from the first releasing type. The method further includes removing the plurality of integrated circuit packages from the carrier after the laser cutting and while the plurality of integrated circuit packages are attached to the first structure. The method further includes removing the plurality of integrated circuit packages from the first structure after the removing the plurality of integrated circuit packages from the carrier.

In another embodiment, a method of making an integrated circuit package includes attaching a panel to a carrier. The panel includes a first major side and a second major side. The second major side being an opposing side to the first major side. The attaching includes attaching the panel to the carrier at the first major side with an adhesive of a first releasing type. The panel includes a plurality of integrated circuit chips encapsulated with an encapsulant. The method includes forming at least one interconnect layer on the second major side. The panel is supported by the carrier during the forming. The method includes laser cutting the panel into a plurality of integrated circuit packages after the forming. The panel is supported by the carrier during the laser cutting. Each integrated circuit package of the plurality of integrated circuit packages includes at least one integrated circuit chip of the plurality of integrated circuit chips. The method includes after the laser cutting, attaching a tape to each integrated circuit package of the plurality of integrated circuit packages at an opposite side to the first major side of the panel with an adhesive of a second releasing type that is different from the first releasing type. The method further includes removing the plurality of integrated circuit packages from the carrier after the laser cutting and while the plurality of integrated circuit packages are attached to the tape. The method still further includes removing the plurality of integrated circuit packages from the tape.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for making an integrated circuit package comprising:
    providing a panel attached to a carrier, the panel including a first major surface attached to the carrier, the panel including a plurality of integrated circuit chips encapsulated with an encapsulant;
    forming at least one interconnect layer on a second major surface of the panel, the second major surface being an opposite surface to the first major surface, the panel being supported by the carrier during the forming;
    laser cutting the panel into a plurality of integrated circuit packages after the forming, the panel being supported by the carrier during the laser cutting, wherein each integrated circuit package includes at least one integrated circuit chip of the plurality of integrated circuits chips;
    removing the plurality of integrated circuit packages from the carrier after the laser cutting.

2. The method of claim 1 further comprising:
    after the removing, attaching a second panel to the carrier, the second panel including a first major surface attached to the carrier, the second panel including a second plurality of integrated circuit chips encapsulated with an encapsulant;
    forming at least one interconnect layer on the second major surface of the second panel, the second major surface of the second panel being an opposite surface to the first major surface of the second panel, the second panel being supported by the carrier during the forming;
    laser cutting the second panel into a second plurality of integrated circuit packages after the forming, the second panel being supported by the carrier during the laser cutting, wherein each integrated circuit package of the second plurality of integrated circuit packages includes at least one integrated circuit chip of the second plurality of integrated circuit chips;
    removing the second plurality of integrated circuit packages from the carrier after the laser cutting.

3. The method of claim 1 wherein the laser cutting the panel includes laser cutting with a laser beam having a wavelength in a range of 350-530 nanometers.

4. The method of claim 1 wherein the laser cutting the panel includes laser cutting with a laser beam at a power level in a range of 5-50 watts.

5. The method of claim 1 wherein the laser cutting the panel includes laser cutting with a laser beam at a first power level and a first wavelength, wherein the carrier is of a material that is resistant to damage of the laser beam during the laser cutting.

6. The method of claim 5 wherein the carrier is made of ceramic alumina.

7. The method of claim 1 wherein the panel is attached to the carrier with an adhesive, wherein the removing the plurality of integrated circuit packages from the carrier includes exposing the carrier to a solution for releasing the adhesive.

8. The method of claim 1 further comprising:
    after the laser cutting and before the removing, attaching a tape to each of the integrated circuit packages of the plurality of integrated circuit packages with an adhesive;
    removing the plurality of integrated circuit packages from the tape after the removing the plurality of integrated circuit packages from the carrier.

9. A method of making an integrated circuit package comprising:
    providing a panel attached to a carrier, the panel including a first major surface attached to the carrier with an adhesive of a first releasing type, the panel including a plurality of integrated circuit chips encapsulated with an encapsulant;
    laser cutting the panel into a plurality of integrated circuit packages, the panel being supported by the carrier during the laser cutting, wherein each integrated circuit package of the plurality of integrated circuit packages includes at least one integrated circuit chip of the plurality of integrated circuit chips;
    after the laser cutting, attaching a first structure to each integrated circuit package of the plurality of integrated circuit packages at an opposite side from the first major surface of the panel with an adhesive of a second releasing type that is different from the first releasing type;
    removing the plurality of integrated circuit packages from the carrier after the laser cutting and while the plurality of integrated circuit packages are attached to the first structure;
    removing the plurality of integrated circuit packages from the first structure after the removing the plurality of integrated circuit packages from the carrier.

10. The method of claim 9 wherein the first structure is a tape material.

11. The method of claim 9 wherein the first releasing type is characterized as a solution releasing type, wherein the removing the plurality of integrated circuit packages from the carrier includes exposing the adhesive of the first releasing type to a solution for releasing the adhesive.

12. The method of claim 11 where the adhesive of a second type is characterized as an ultraviolet (UV) release adhesive, wherein the removing the plurality of integrated circuit packages from the first structure includes exposing the adhesive of the second releasing type to UV radiation.

13. The method of claim 9 further comprising:
prior to the laser cutting, forming at least one interconnect layer on a second major surface of the panel, the panel being supported by the carrier during the forming.

14. The method of claim 9 wherein the laser cutting the panel includes laser cutting with a laser beam having a wavelength in a range of 350-530 nanometers.

15. The method of claim 9 wherein the laser cutting the panel includes laser cutting with a laser beam at a power level in a range of 5-50 watts.

16. The method of claim 9 wherein the laser cutting the panel includes laser cutting with a laser beam at a first power level and a first wavelength, wherein the carrier is of a material that is resistant to damage of the laser beam during the laser cutting.

17. The method of claim 9 further comprising:
after removing the plurality of integrated circuit packages from the carrier, attaching a second panel to the carrier, the second panel including a first major surface attached to the carrier with an adhesive of the first releasing type, the second panel including a second plurality of integrated circuit chips encapsulated with an encapsulant;
laser cutting the second panel into a second plurality of integrated circuit packages after the attaching the second panel to the carrier, the second panel being supported by the carrier during the laser cutting, wherein each integrated circuit package of the second plurality of integrated circuit packages includes at least one integrated circuit chip of the second plurality of integrated circuit chips;
removing the second plurality of integrated circuit packages from the carrier after the laser cutting.

18. The method of claim 9 wherein the carrier is made of ceramic alumina.

19. The method of claim 9 wherein the removing the plurality of integrated circuit packages from the first structure includes individually removing each integrated circuit package of the plurality of integrated circuit packages with an automatic package picking device.

20. A method of making an integrated circuit package comprising:
attaching a panel to a carrier, the panel including a first major side and a second major side, the second major side being an opposing side to the first major side, the attaching includes attaching the panel to the carrier at the first major side with an adhesive of a first releasing type, the panel including a plurality of integrated circuit chips encapsulated with an encapsulant;
forming at least one interconnect layer on the second major side, the panel being supported by the carrier during the forming;
laser cutting the panel into a plurality of integrated circuit packages after the forming, the panel being supported by the carrier during the laser cutting, wherein each integrated circuit package of the plurality of integrated circuit packages includes at least one integrated circuit chip of the plurality of integrated circuit chips;
after the laser cutting, attaching a tape to each integrated circuit package of the plurality of integrated circuit packages at an opposite side to the first major side of the panel with an adhesive of a second releasing type that is different from the first releasing type;
removing the plurality of integrated circuit packages from the carrier after the laser cutting and while the plurality of integrated circuit packages are attached to the tape;
removing the plurality of integrated circuit packages from the tape.

* * * * *